(12) United States Patent
Shimuzu et al.

(10) Patent No.: US 11,482,188 B2
(45) Date of Patent: Oct. 25, 2022

(54) INFORMATION PROCESSING DEVICE, CONTROL CIRCUIT, AND INFORMATION PROCESSING METHOD

(71) Applicant: Sony Corporation, Tokyo (JP)

(72) Inventors: Toshihide Shimuzu, Tokyo (JP); Hiromasa Miyata, Tokyo (JP); Junji Ohama, Tokyo (JP)

(73) Assignee: SONY CORPORATION, Tokyo (JP)

( * ) Notice: Subject to any disclaimer, the term of this patent is extended or adjusted under 35 U.S.C. 154(b) by 394 days.

(21) Appl. No.: 16/500,816

(22) PCT Filed: Mar. 7, 2018

(86) PCT No.: PCT/JP2018/008874
§ 371 (c)(1),
(2) Date: Oct. 4, 2019

(87) PCT Pub. No.: WO2018/211789
PCT Pub. Date: Nov. 22, 2018

(65) Prior Publication Data
US 2021/0407458 A1    Dec. 30, 2021

(30) Foreign Application Priority Data
May 16, 2017 (JP) .............................. JP2017-097130

(51) Int. Cl.
*G09G 5/00*    (2006.01)
*G06F 3/14*    (2006.01)
(Continued)

(52) U.S. Cl.
CPC .............. *G09G 5/006* (2013.01); *G06F 3/14* (2013.01); *G06F 13/4282* (2013.01);
(Continued)

(58) Field of Classification Search
CPC ................................. G01N 27/416; H02J 7/04
See application file for complete search history.

(56) References Cited

U.S. PATENT DOCUMENTS

2009/0267609 A1* 10/2009 Suzuki .................. H01M 10/48
324/426
2011/0204850 A1* 8/2011 Kaino ............... H02J 7/007182
320/162
(Continued)

FOREIGN PATENT DOCUMENTS

EP           2843914 A1    3/2015
JP       2013-089756 A    5/2013
(Continued)

OTHER PUBLICATIONS

International Search Report and Written Opinion dated May 29, 2018 for PCT/JP2018/008874 filed on Mar. 7, 2018, 7 pages including English Translation of the International Search Report.
(Continued)

*Primary Examiner* — Getente A Yimer
(74) *Attorney, Agent, or Firm* — Xsensus LLP

(57) ABSTRACT

There is provided an information processing device including a voltage detection unit configured to monitor a voltage value of a signal output at a predetermined timing, and a signal control unit configured to stop output of the signal if the voltage value after a predetermined time elapses from when the voltage value detected by the voltage detection unit exceeds a first value does not exceed a second value greater than the first value.

20 Claims, 12 Drawing Sheets

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1- | $V_{BUS}$ | CC1 | D+ | D- | SBU1 | $V_{BUS}$ | RX2- | RX2+ | GND |
| GND | RX1+ | RX1- | $V_{BUS}$ | SBU2 | D- | D+ | CC2 | $V_{BUS}$ | TX2- | TX2+ | GND |
| B12 | B11 | B10 | B9 | B8 | B7 | B6 | B5 | B4 | B3 | B2 | B1 |

(51) Int. Cl.
  *G06F 13/42*     (2006.01)
  *G01R 19/165*    (2006.01)
  *G06F 3/00*      (2006.01)
  *G06F 13/40*     (2006.01)

(52) U.S. Cl.
  CPC .... *G01R 19/165* (2013.01); *G06F 2213/0042* (2013.01); *G09G 2330/027* (2013.01); *G09G 2354/00* (2013.01)

(56) References Cited

U.S. PATENT DOCUMENTS

| | | | |
|---|---|---|---|
| 2014/0013012 A1 | 1/2014 | Terlizzi et al. | |
| 2014/0176986 A1* | 6/2014 | Tomofuji | H04N 1/00904 |
| | | | 358/1.14 |
| 2014/0218045 A1 | 8/2014 | Shoykhet et al. | |
| 2014/0223926 A1* | 8/2014 | Hatakeyama | H02M 1/32 |
| | | | 318/473 |
| 2015/0049407 A1 | 2/2015 | Tanimoto et al. | |
| 2017/0110835 A1 | 4/2017 | Hasegawa et al. | |
| 2018/0032013 A1* | 2/2018 | Fukushima | G03G 15/5004 |
| 2018/0270407 A1* | 9/2018 | Ito | H04N 5/23203 |

FOREIGN PATENT DOCUMENTS

| | | |
|---|---|---|
| JP | 2015-037269 A | 2/2015 |
| JP | 2017-079048 A | 4/2017 |

OTHER PUBLICATIONS

Extended European Search Report dated Apr. 2, 2020, issued in corresponding European Patent Application No. 18801868.3.

* cited by examiner

FIG. 1

| A1 | A2 | A3 | A4 | A5 | A6 | A7 | A8 | A9 | A10 | A11 | A12 |
|---|---|---|---|---|---|---|---|---|---|---|---|
| GND | TX1+ | TX1- | $V_{BUS}$ | CC1 | D+ | D- | SBU1 | $V_{BUS}$ | RX2- | RX2+ | GND |

| GND | RX1+ | RX1- | $V_{BUS}$ | SBU2 | D- | D+ | CC2 | $V_{BUS}$ | TX2- | TX2+ | GND |
|---|---|---|---|---|---|---|---|---|---|---|---|
| B12 | B11 | B10 | B9 | B8 | B7 | B6 | B5 | B4 | B3 | B2 | B1 |

INFORMATION PROCESSING DEVICE, CONTROL CIRCUIT, AND INFORMATION PROCESSING METHOD

CROSS-REFERENCE TO RELATED APPLICATIONS

The present application is based on PCT filing PCT/JP2018/008874, filed Mar. 7, 2018, which claims priority to JP 2017-097130, filed May 16, 2017, the entire contents of each are incorporated herein by reference.

TECHNICAL FIELD

The present disclosure relates to an information processing device, a control circuit, and an information processing method.

BACKGROUND ART

If electricity is applied to a terminal in a state where water is attached to the terminal, corrosion of the terminal proceeds due to the electrolysis of the water. Thus, a technique of suppressing corrosion of a terminal is described, for example, in Patent Document 1.

CITATION LIST

Patent Document

Patent Document 1: Japanese Patent Application Laid-Open No. 2013-89756

SUMMARY OF THE INVENTION

Problems to be Solved by the Invention

For example, a connector conforming to the Universal Serial Bus (USB) Type-C standard detects a device connection by periodically outputting a pulse to a predetermined pin. Here, if water is attached to the connector, corrosion of the terminal proceeds due to the output of the pulse. In such a device including a connector with a standard for periodically outputting a pulse to a predetermined pin, it is required to suppress corrosion of a terminal while conforming to the standard.

Thus, in the present disclosure, an information processing device, a control circuit, and an information processing method which are capable of suppressing corrosion of a terminal to which a cable or the like is connected, and which are novel and improved.

Solutions to Problems

According to the present disclosure, there is provided an information processing device including a voltage detection unit configured to monitor a voltage value of a signal output to a predetermined terminal of a connector at a predetermined timing, and a signal control unit configured to stop output of the signal if the voltage value after a predetermined time has elapsed from when the voltage value detected by the voltage detection unit exceeds a first value does not exceed a second value greater than the first value.

In addition, according to the present disclosure, there is provided a control circuit including a voltage detection unit configured to monitor a voltage value of a signal output at a predetermined timing, and a signal control unit configured to stop output of the signal if the voltage value after a predetermined time has elapsed from when the voltage value detected by the voltage detection unit exceeds a first value does not exceed a second value greater than the first value.

In addition, according to the present disclosure, there is provided a control method including monitoring a voltage value of a signal output at a predetermined timing, and stopping output of the signal if the voltage value after a predetermined time has elapsed from when the detected voltage value exceeds a first value does not exceed a second value greater than the first value.

Effects of the Invention

As described above, according to the present disclosure, it is possible to provide an information processing device, a control circuit, and an information processing method which are capable of suppressing corrosion of a terminal to which a cable or the like is connected, and which are novel and improved.

Note that, the above-described effects are not necessarily limited, and any of effects disclosed in the present specification, or other effects that may be understood from the present specification may also be exhibited in addition to the above-described affects or instead of the above-described effects.

BRIEF DESCRIPTION OF DRAWINGS

FIG. 1 is an explanatory diagram illustrating pin arrangement of a USB Type-C standard connector.

MODE FOR CARRYING OUT THE INVENTION

Figure 2:
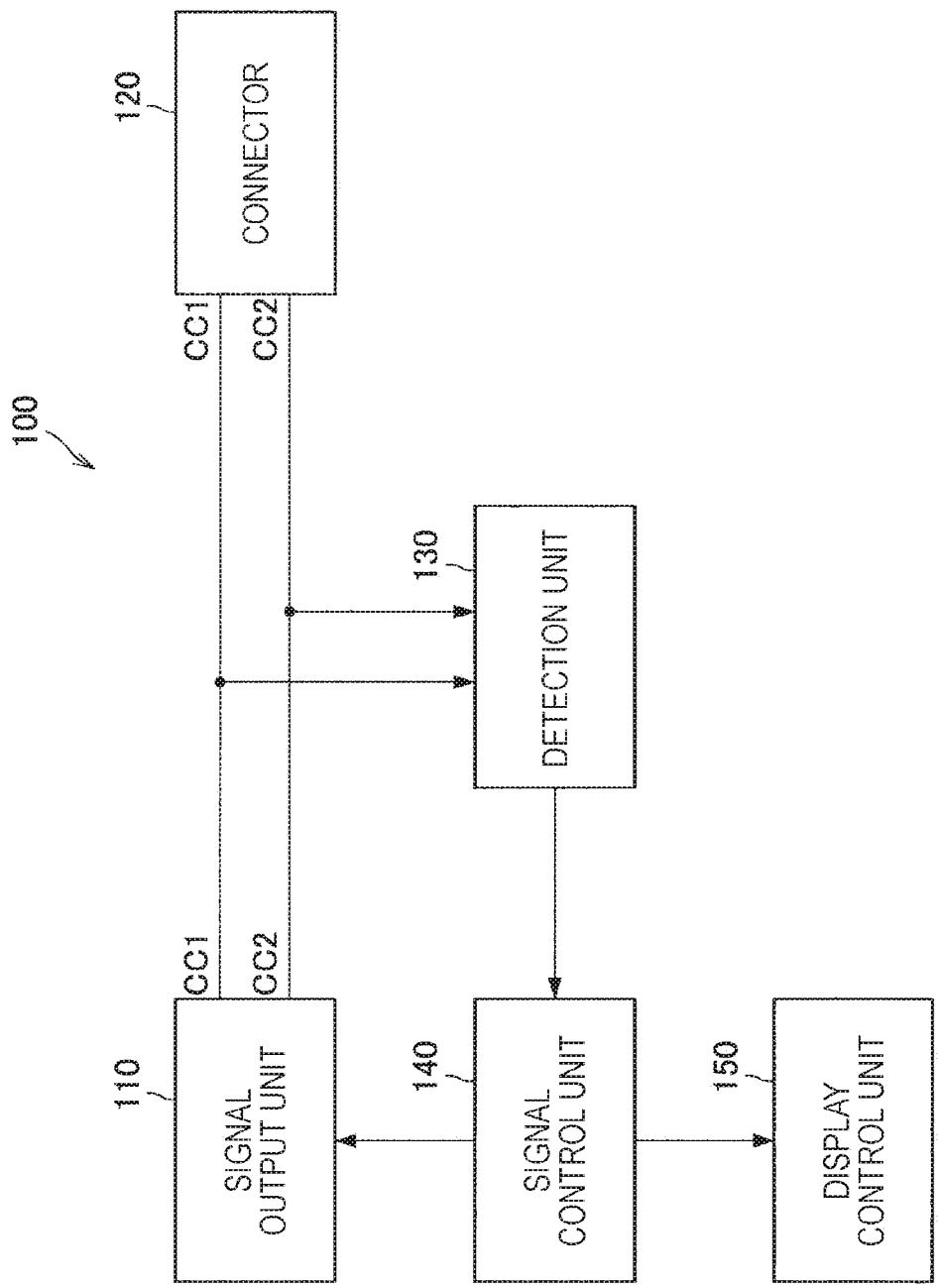
FIG. 2 is an explanatory diagram illustrating a configuration example of an information processing device 100 according to an embodiment of the present disclosure.

Hereinafter, preferred embodiments of the present disclosure will be described in detail with reference to the accompanying drawings. Note that, in the present specification and the drawings, constituents having substantially the same functional configuration will be assigned the same reference numerals and redundant description will be omitted.

Note that, the description will be made in the following order.
1. Embodiment of Present Disclosure
1.1 Background
1.2 Configuration Example
1.3 Operation Example
2. Summary

1. EMBODIMENT OF PRESENT DISCLOSURE

1.1 Background

First, the background of an embodiment of the present disclosure will be described before the details of the embodiment of the present disclosure will be described.

A device such as a personal computer, a smartphone, or a tablet terminal is equipped with a connector for connecting another device. Such a connector conforms a predetermined standard so as to connect various devices. As the standard, the Universal Serial Bus (USB) Type-C standard has been spreading in recent years. The Universal Serial Bus (USB) Type-C standard is a small 24-pin connector standard capable of allowing connection regardless of the direction when connecting a device and a cable. In the following description, a device having a port that can be either a port for supplying power or a port for receiving power, such as a personal computer, a smartphone, or a tablet terminal is referred to as a dual role port (DRP) device, and a device connected to the DRP device by inserting a cable or the like into a connector is referred to as a peripheral device.

FIG. 1 is an explanatory diagram illustrating pin arrangement of a USB Type-C standard connector. The USB Type-C standard detects connection of a peripheral device by two configuration channel (CC) pins of CC1 and CC2 illustrated in FIG. 1. Furthermore, the DRP device periodically outputs a pulse to the two CC pins of CC1 and CC2 in order to detect connection of a peripheral device, and detects connection of a peripheral device by a change in voltage.

However, when the DRP device periodically outputs a pulse in order to detect connection of the peripheral device, if water is attached to the connector due to the DRP device being flooded, for example, there is a risk of corrosion of the terminal due to electrolysis. Therefore, by reducing an output voltage of the pulse, reducing a duty ratio of the pulse, or reducing an output cycle of the pulse, it is possible to suppress corrosion of the terminal in a case where water is attached to the connector, to some extent. However, in a range conforming to the USB Type-C standard, the pulse cannot be reduced enough to suppress corrosion.

With the pin arrangement illustrated in FIG. 1, four GND terminals are defined in the USB Type-C standard connector. Thus, there is a method of using one of the four GND terminals as a terminal for detecting connection of a cable. Since using a GND terminal as a terminal for detecting connection of a cable is not defined in the USB Type-C standard, it is possible to uniquely define an output voltage of a pulse, a duty ratio of a pulse, an output cycle of a pulse, and the like. Thus, it is possible to suppress corrosion of a terminal in a case where water is attached to the connector, by using the GND terminal as a terminal for detecting connection of a peripheral device.

However, it is not possible to know what kind of cable is connected to the connector of the DRP device. For example, although four GND terminals are defined in the USB Type-C standard connector, if a cable of which only one GND terminal is actually grounded is connected, connection of the cable may not be detected in some cases. In addition, for example, in a case where a detection operation is stopped during a standby state of the DRP device, if a cable is connected to the connector during the standby state, the DRP device cannot detect connection of a cable.

Thus, in view of the above described point, the disclosing party of the present disclosure diligently studied a technique capable of detecting connection of a peripheral device even in the standby state and suppressing corrosion of a terminal by detecting that water is attached to the connector, in a standard of periodically outputting a signal for detecting connection of a peripheral device, such as the USB Type-C standard. As a result, as described later, the disclosing party of the present disclosure has devised a technique capable of detecting connection of a peripheral device even in a standby state and of completely preventing corrosion of a terminal by stopping output of a signal for detection when it is detected that water is attached to a connector.

Heretofore, the background to the embodiments of the present disclosure has been described. Subsequently, the embodiments of the present disclosure will be described in detail.

1.2 Configuration Example

First, a configuration example of an information processing device according to an embodiment of the present disclosure will be described. FIG. 2 is an explanatory diagram illustrating a configuration example of an information processing device 100 according to an embodiment of the present disclosure. Hereinafter, the configuration example of the information processing device 100 according to the embodiment of the present disclosure will be described using FIG. 2.

As illustrated in FIG. 2, the information processing device 100 according to the embodiment of the present disclosure includes a signal output unit 110, a connector 120, a detection unit 130, a signal control unit 140, and a display control unit 150.

The signal output unit 110 outputs a signal to the connector 120. The connector 120 is a connector conforming to the USB Type-C standard in the present embodiment, and in FIG. 2, the signal output unit 110 is configured to output a signal to two pins, CC1 and CC2, of the USB Type-C standard for the simplification of the description. Of course, needless to say, the signal output unit 110 outputs a signal to other pins of the connector 120.

The signal output unit 110 periodically outputs a connection detection signal in order to detect connection of a peripheral device to the connector 120. In the present embodiment, the connection detection signal that the signal output unit 110 outputs is a signal that conforms to the USB Type-C standard and is for detecting connection. As the peripheral device, for example, a charger equipped with a secondary battery, a speaker, headphones, a display, and the like may be used. The signal output unit 110 outputs a rectangular wave signal in order to detect connection of a peripheral device to the connector 120. If a peripheral device is connected to the connector 120, a voltage value of the signal is reduced due to voltage division, and thus connection of a peripheral device to the connector 120 can be detected by monitoring the voltage value of the connection detection signal output from the signal output unit 110.

As described above, the connector 120 is a connector conforming to the USB Type-C standard in the present embodiment. In FIG. 2, only signal lines corresponding to the two pins, CC1 and CC2, of the connector 120.

The detection unit 130 detects a voltage value of the connection detection signal that is output from the signal output unit 110 to the two pins, CC1 and CC2, of the connector 120. Specifically, the detection unit 130 detects whether a voltage value at a time point of time t2 after a predetermined time elapses from time t1 at a time point when the voltage value of the connection detection signal that the signal output unit 110 outputs exceeds a predetermined value V1, exceeds a predetermined value V2 that is greater than the value V1. The reason that the detection unit 130 performs such a detection operation will be described.

Figure 3:
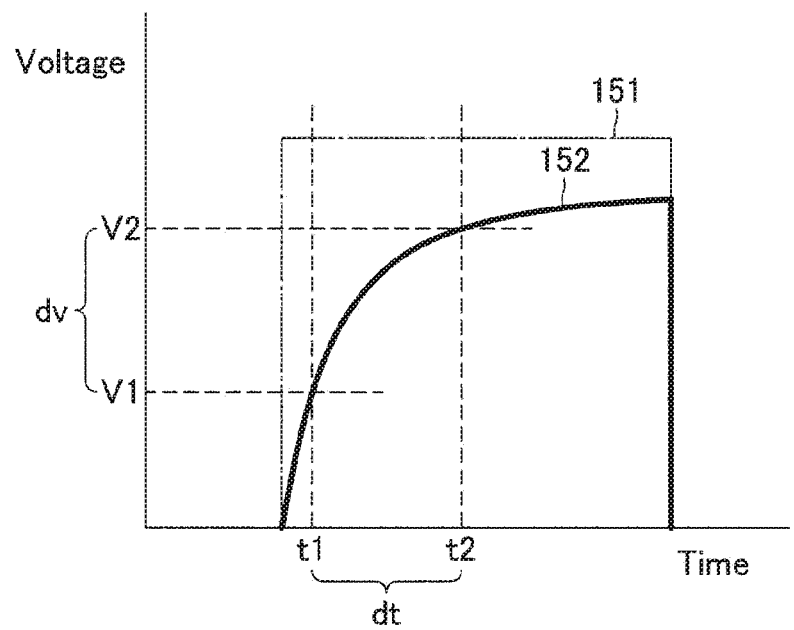
FIG. 3 is an explanatory diagram illustrating a relationship between time and voltages of a connection detection signal that a signal output unit 110 outputs.

FIG. 3 is an explanatory diagram illustrating a relationship between time and voltages of a connection detection signal that is output from a signal output unit 110. In the graph illustrated in FIG. 3, the horizontal axis represents time and the vertical axis represents a voltage. Reference numeral 151 indicates a normal signal waveform. Normally, in other words, in a state where water is not attached to the connector 120, a signal is a rectangular wave as illustrated by reference numeral 151.

Meanwhile, reference numeral 152 indicates a waveform of the connection detection signal in a state where water is attached to the connector 120. When water is attached to the connector 120, the signal that the signal output unit 110 outputs has a smooth rise. This is because of electrical conduction by water and capacitive components. Although the rise is different depending on the type of liquid, the more electrolyte components in water, the smoother the rise.

The detection unit 130 detects a voltage value in the above-described manner by using the fact that the rise of the connection detection signal becomes smooth in a state where water is attached to the connector 120. In other words, with reference to FIG. 3, if a voltage value at a time point of time t2 after a predetermined time elapses from time t1 at a time point when the voltage value exceeds the predetermined value V1, does not exceed the predetermined value V2 greater than the value V1, it is possible to determine that water is attached to the connector 120.

If a voltage value of the connection detection signal at a time point of time t2 after a predetermined time elapses from time t1 at a time point when the voltage value of the connection detection signal exceeds a predetermined value V1, does not exceed a predetermined value V2 greater than the value V1, the detection unit 130 outputs a signal indicating the fact to the signal control unit 140.

Figure 4:
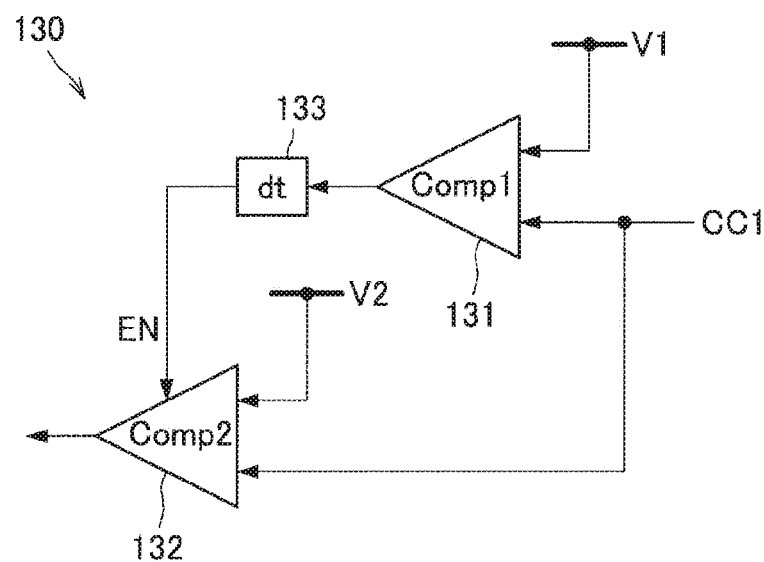
FIG. 4 is an explanatory diagram illustrating a specific circuit configuration example of a detection unit 130 according to an embodiment of the present disclosure.

FIG. 4 is an explanatory diagram illustrating a specific circuit configuration example of the detection unit 130 according to the embodiment of the present disclosure. A circuit configuration example of the detection unit 130 that detects a voltage value of the connection detection signal that the signal output unit 110 outputs to CC1 of the connector 120 is illustrated in FIG. 4.

As illustrated in FIG. 4, the detection unit 130 includes comparators 131 and 132, and a delay device 133. The comparator 131 compares the predetermined voltage value V1 with the voltage value of the connection detection signal that the signal output unit 110 outputs to CC1 of the connector 120. Then, if the voltage value of the connection detection signal that the signal output unit 110 outputs to CC1 of the connector 120 is greater than the predetermined voltage value V1, the comparator 131 outputs a signal to the comparator 132 after the signal is delayed for a predetermined time dt in the delay device 133. When the comparator 132 receives a signal from the comparator 131, the comparator 132 compares the predetermined voltage value V2 with the voltage value of the connection detection signal that the signal output unit 110 outputs to CC1 of the connector 120. Then, if the voltage value of the connection detection signal that the signal output unit 110 outputs to CC1 of the connector 120 is not greater than the predetermined voltage value V2, the comparator 132 outputs a signal indicating the fact to the signal control unit 140.

The signal control unit 140 controls the output of a signal from the signal output unit 110. Specifically, when the signal control unit 140 receives a signal indicating that the voltage value of the connection detection signal at a time point of time t2 after a predetermined time elapses from time t1 at a time point when the voltage value of the connection detection signal exceeds the predetermined value V1, does not exceed the predetermined value V2 greater than the value V1, from the detection unit 130, the signal control unit 140 stops output of the connection detection signal from the signal output unit 110. In other words, when it is detected that the connector 120 is wet with water, the signal control unit 140 causes the signal output unit 110 not to output the connection detection signal in order to prevent corrosion of a terminal of the connector 120.

In addition, when the signal control unit 140 receives a signal indicating that the voltage value of the connection detection signal at a time point of time t2 after a predetermined time elapses from time t1 at a time point when the voltage value of the connection detection signal exceeds the predetermined value V1, does not exceed the predetermined value V2 greater than the value V1, in other words, that water is attached to the connector 120, from the detection unit 130, the signal control unit 140 outputs the fact to the display control unit 150.

The display control unit 150 controls the display of characters, images, and other information on the display unit which is not illustrated. In the present embodiment, when the display control unit 150 receives a signal indicating that water is attached to the connector 120, from the signal control unit 140, the display control unit 150 outputs, according to the reception, a signal for displaying the fact that water is attached to the connector 120 on the display unit.

Note that, as a method for informing a user of the fact that water is attached to the connector 120, the information processing device 100 may perform, for example, light emission of a light emitting diode (LED), output of sound from a speaker, and the like in addition to the display of information on the display unit.

The signal output unit 110, the detection unit 130, the signal control unit 140, and the display control unit 150 are formed as, for example, a field programmable gate array (FPGA). The signal output unit 110, the detection unit 130, the signal control unit 140, and the display control unit 150 may not all be formed as the FPGA, for example, only the detection unit 130 may be formed as the FPGA, and the detection unit 130 and the signal control unit 140 may be formed as the FPGA.

The information processing device 100 according to the embodiment of the present disclosure has the configuration as illustrated in FIG. 2, and thus, it is possible to stop output of a signal for detecting connection of a peripheral device to the connector 120 by detecting that water is attached to the connector 120. It is possible to suppress corrosion of a terminal of the connector 120 by stopping output of a signal for detecting connection of a peripheral device to the connector 120 when it is detected that water is attached to the connector 120.

Heretofore, the configuration example of the information processing device 100 according to the embodiment of the present disclosure has been described. Subsequently, an operation example of the information processing device 100 according to the embodiment of the present disclosure will be described in detail.

1.3 Operation Example

Figure 5:
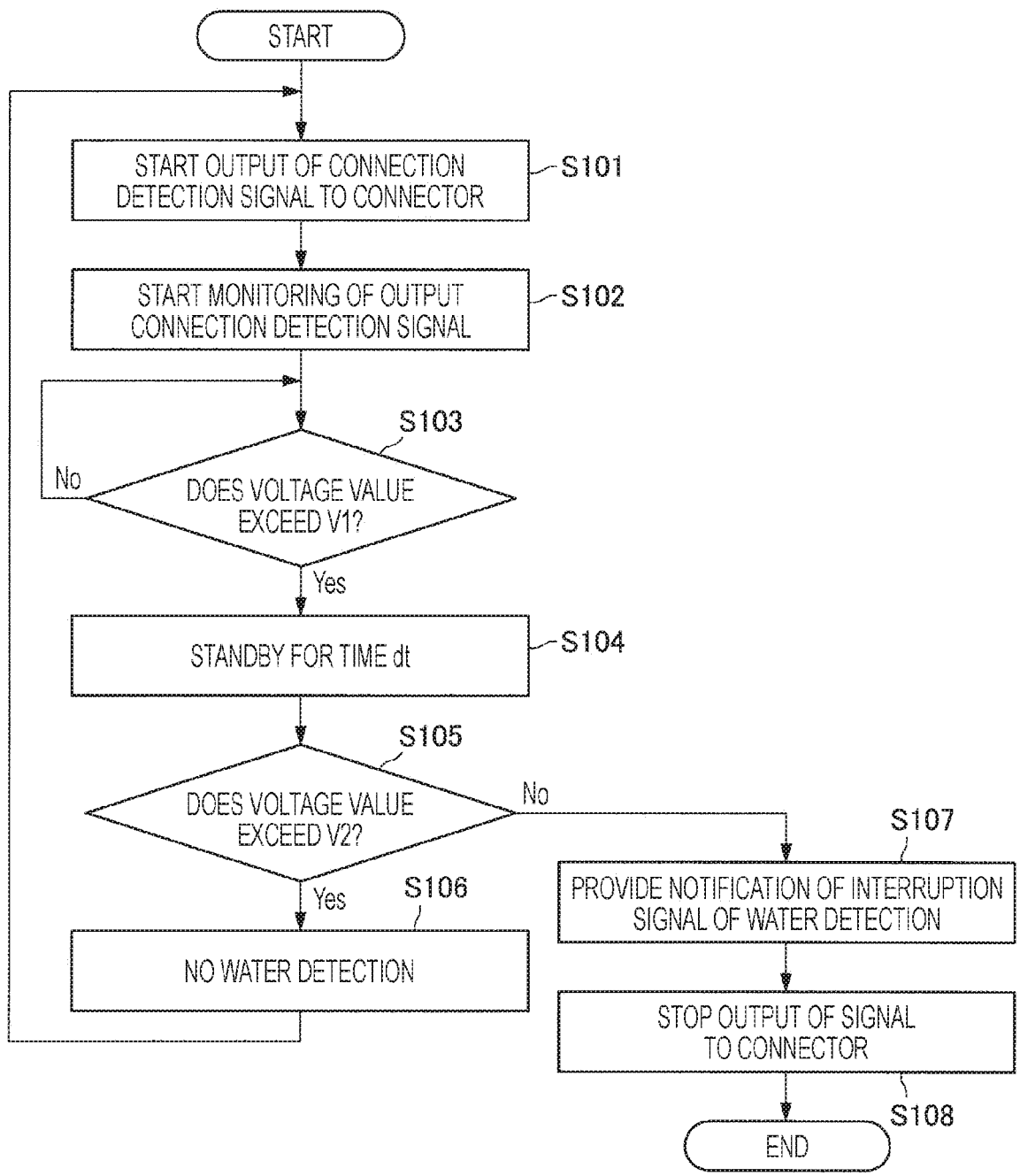
FIG. 5 is a flowchart illustrating an operation example of an information processing device 100 according to an embodiment of the present disclosure.

FIG. 5 is a flowchart illustrating an operation example of the information processing device 100 according to an embodiment of the present disclosure. An operation example of the information processing device 100 in a case where water wetting of the connector 120 is detected is illustrated in FIG. 5. Hereinafter, the operation example of the information processing device 100 according to the embodiment of the present disclosure will be described using FIG. 5.

When the information processing device 100 starts output of a connection detection signal from the signal output unit 110 to the connector 120 (step S101), the information processing device 100 starts monitoring of the connection detection signal using the detection unit 130 (step S102).

Subsequently, the information processing device 100 stands by until the voltage value of the connection detection signal output from the signal output unit 110 exceeds the predetermined value V1 in the detection unit 130 (step S103). When the voltage value of the connection detection signal exceeds the predetermined value V1 (step S103, Yes), subsequently the information processing device 100 stands by for the predetermined time dt (step S104), and then the information processing device 100 determines whether the voltage value of the connection detection signal during the corresponding time exceeds the predetermined value V2 (step S105).

As a result of the determination in step S105, if the voltage value of the connection detection signal exceeds the predetermined value V2 (step S105, Yes), the information processing device 100 determines that there is no water detection (step S106) and continues the output of the connection detection signal to the connector 120.

Meanwhile, as a result of the determination in step S105, if the voltage value of the connection detection signal does not exceed the predetermined value V2 (step S105, No), the information processing device 100 determines that the connector 120 is wet with water, and provides notification of an interruption signal of water detection from the signal control unit 140 (step S107). Then, the information processing device 100 stops output of the connection detection signal to the connector 120 due to the generation of the interruption signal from the signal control unit 140 (step S108).

Figure 6:
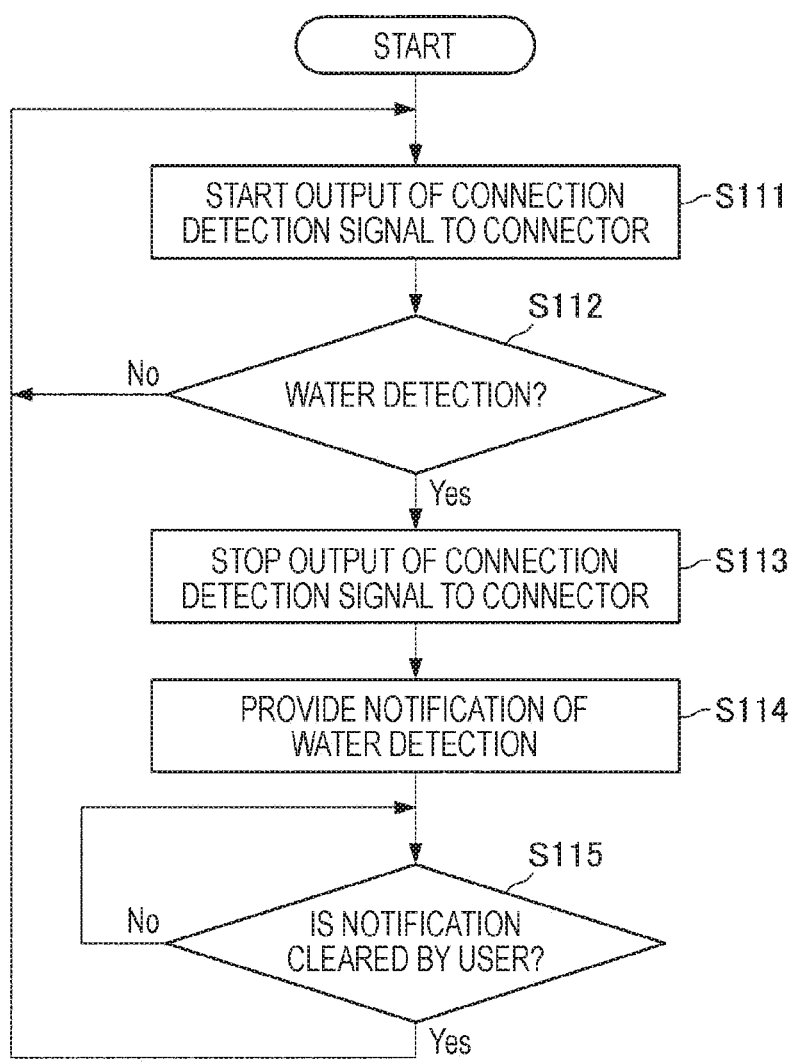
FIG. 6 is a flowchart illustrating an operation example of an information processing device 100 according to an embodiment of the present disclosure.

FIG. 6 is a flowchart illustrating an operation example of the information processing device 100 according to the embodiment of the present disclosure. An operation example of the information processing device 100 in a case where water wetting of the connector 120 is detected is illustrated in FIG. 6. Hereinafter, the operation example of the information processing device 100 according to the embodiment of the present disclosure will be described using FIG. 6.

When the information processing device 100 starts output of a connection detection signal from the signal output unit 110 to the connector 120 (step S111), the information processing device 100 detects water wetting of the connector 120 by the processing as illustrated in FIG. 5 (step S112). If water wetting of the connector 120 is not detected (step S112, No), the information processing device 100 determines that there is no water detection, and continues the output of the connection detection signal to the connector 120.

Meanwhile, if water wetting of the connector 120 is detected (step S112, Yes), the information processing device 100 stops output of the connection detection signal to the connector 120 (step S113). Then, the information processing device 100 performs notification of the fact that the connector 120 is wet with water by the display on a screen or the like (step S114).

The information processing device 100 determines whether the notification is cleared by the user (step S115), and if the notification is cleared by the user (step S115, Yes), the information processing device 100 starts the output of the connection detection signal to the connector 120 again.

Figure 7:
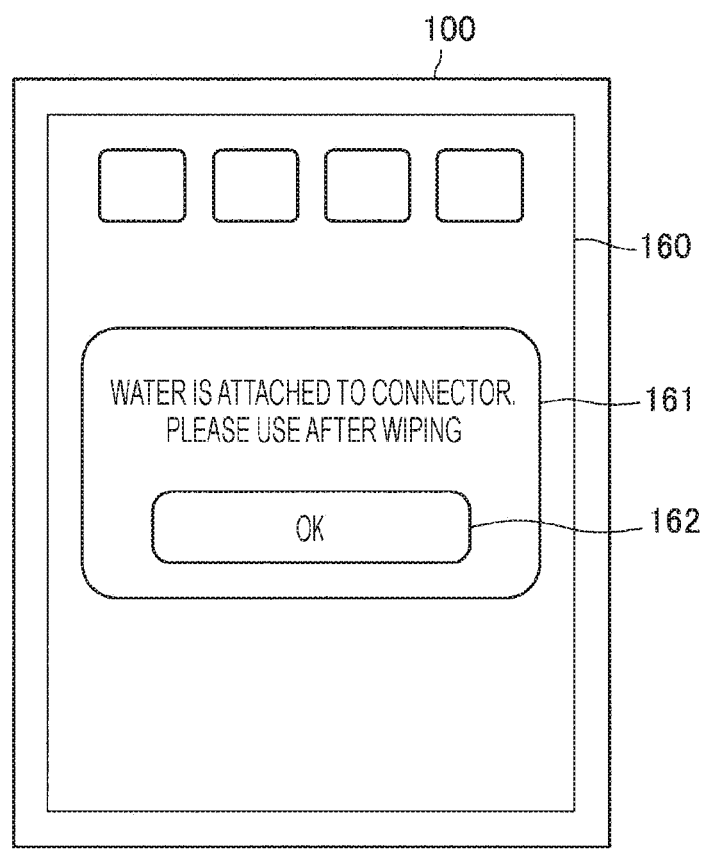
FIG. 7 is an explanatory diagram illustrating an example of a user interface that an information processing device 100 outputs.

FIG. 7 is an explanatory diagram illustrating an example of a user interface that the information processing device 100 outputs. An example in which the information processing device 100 displays a notification message 161 on the display unit 160 when water wetting of the connector 120 is detected is illustrated in FIG. 7. When a button 162 which is displayed in the notification message 161 is touched by the user, the display of the notification message 161 is cleared. When the button 162 is touched by the user, the information processing device 100 deletes the notification message 161 from the display unit 160.

Note that, even when the user clears the notification without wiping water attached to the connector 120, if water wetting of the connector 120 is detected again in step S112, the information processing device 100 stops output of the connection detection signal to the connector 120, and performs notification of the fact that the connector 120 is wet with water by the display on the screen or the like. Accordingly, if the user does not wipe water attached to the connector 120, the output of the connection detection signal to the connector 120 is hardly performed, and thus, the information processing device 100 according to the embodiment of the present disclosure can suppress corrosion of a terminal in a case where water is attached to the connector 120.

In the above description, processing of determining the presence or absence of water wetting of the connector 120 has been performed by detecting the voltage value of the connection detection signal output to the two pins, CC1 and CC2, of the connector 120. However, in addition to water wetting of the connector 120, the voltage value of the connection detection signal may not reach a prescribed potential within the predetermined time in some cases. For example, in some cases, one end of a cable conforming to the USB Type-C standard is connected to the information processing device 100, and the other end of the cable is connected to a connector for conversion from USB Type-C into USB Type-A (hereinafter, referred to as a conversion connector), instead of USB devices. In this case, the voltage value of the pin, CC1 or CC2, of the connector 120 may not reach the prescribed potential within the predetermined time. Thus, while there is a possibility of determining that there is water wetting even though the connector 120 is not wet with water, only one side of the connector 120 may be really wet (either CC1 or CC2 is wet) in some cases. In a case where only one side of the connector 120 is wet, if the output of the connection detection signal is not restricted, corrosion of a terminal of the connector proceeds.

Thus, in the following description, a configuration example and an operation example of the information processing device 100 which can cope with factors that affect the voltage value of the connection detection signal such as connection of the conversion connector will be described. Specifically, if the voltage value of the connection detection signal of only one side of the connector 120 reaches the prescribed potential, the information processing device 100 sets a predetermined timer, and executes an operation such as thinning the output of the connection detection signal during a period of the timer.

Figure 8:
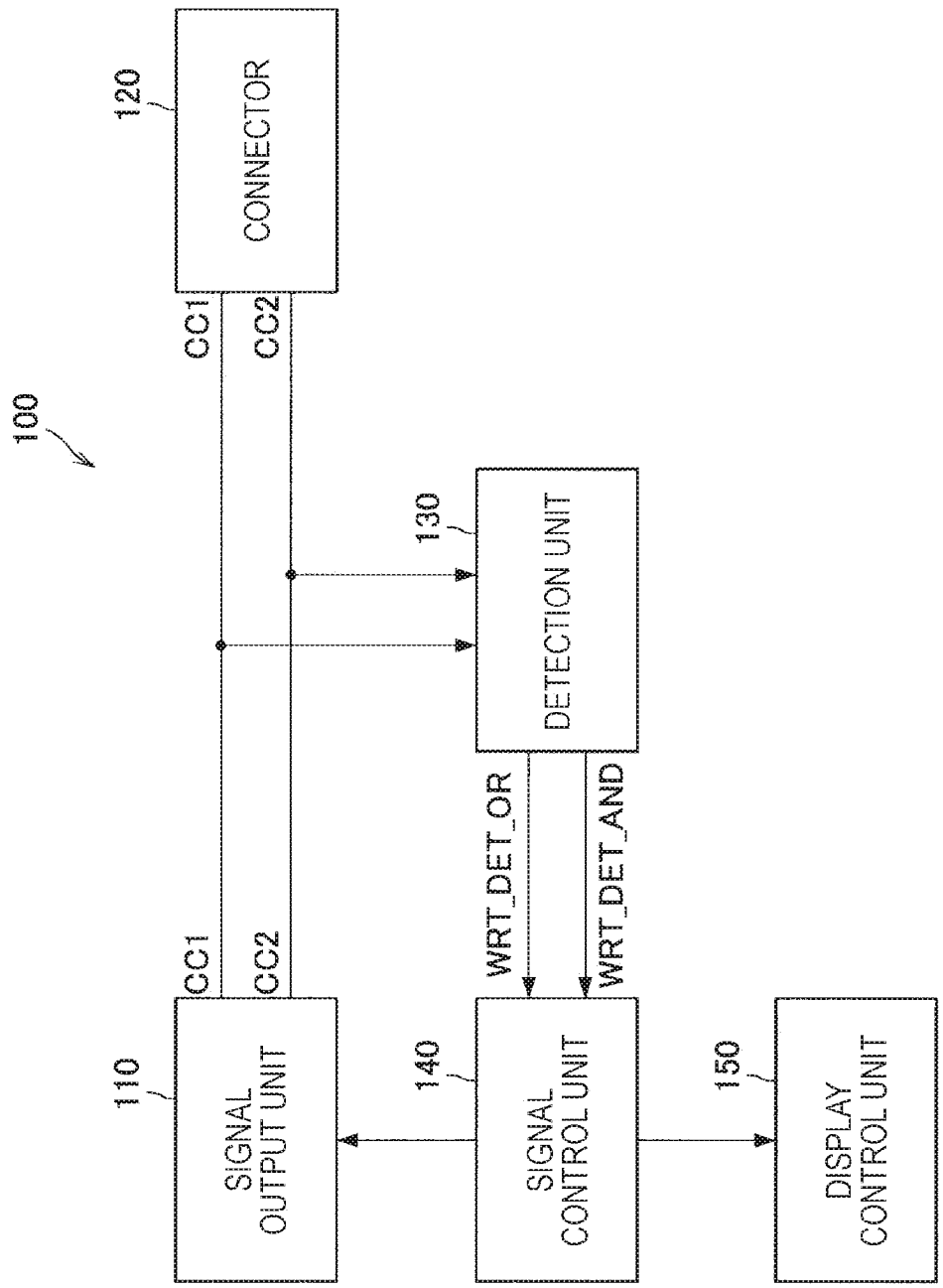
FIG. 8 is an explanatory diagram illustrating a functional configuration example of an information processing device 100 according to an embodiment of the present disclosure.

FIG. 8 is an explanatory diagram illustrating a functional configuration example of the information processing device 100 according to the embodiment of the present disclosure. The difference from the configuration example illustrated in FIG. 2 is that the detection unit 130 outputs two signals WRT_DET_AND and WRT_DET_OR to the signal control unit 140. WRT_DET_AND is a signal which becomes high in a case where the voltage value of both the two pins, CC1 and CC2, of the connector 120 does not reach the prescribed potential within the predetermined time, and WRT_DET_OR is a signal which becomes high in a case where the voltage value of either one of the two pins, CC1 and CC2, of the connector 120 does not reach the prescribed potential within the predetermined time.

Figure 9:
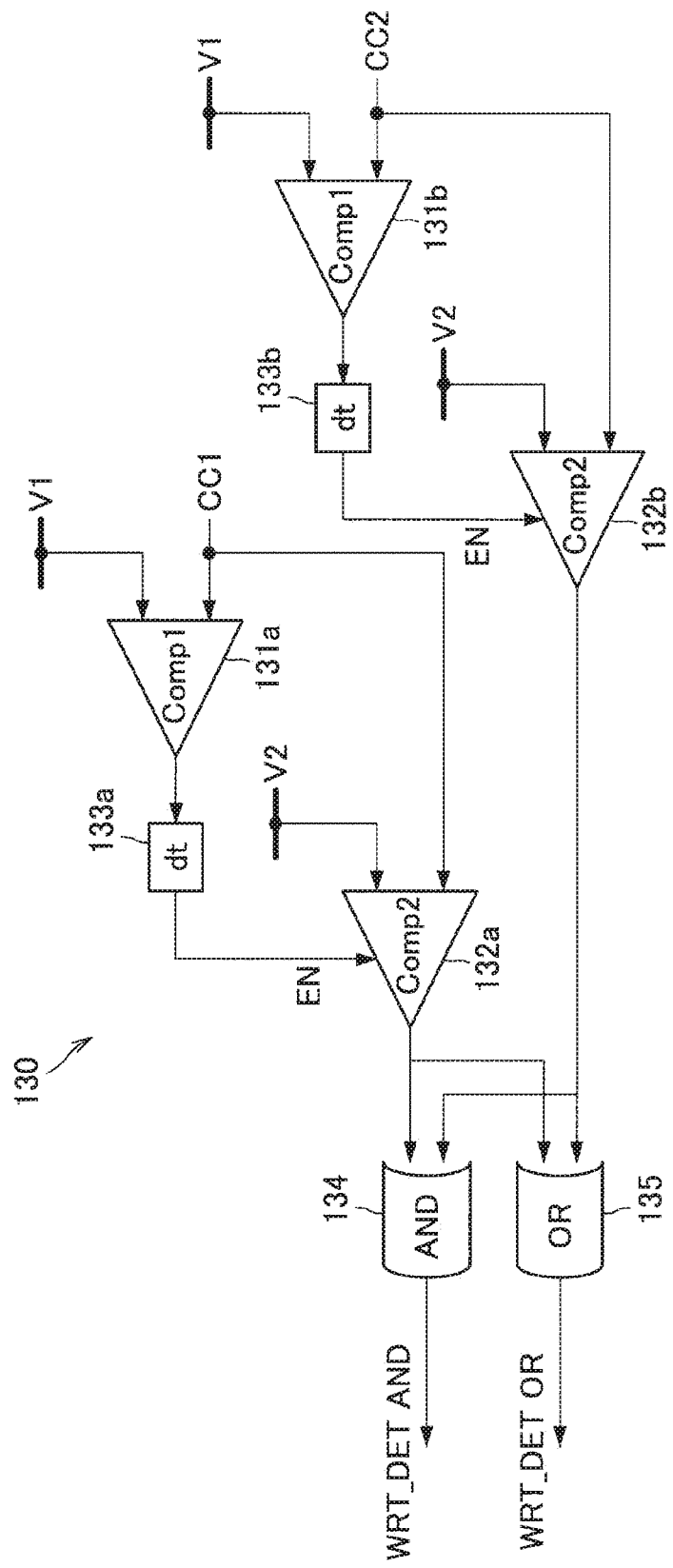
FIG. 9 is an explanatory diagram illustrating a specific circuit configuration example of a detection unit 130 according to an embodiment of the present disclosure.

FIG. 9 is an explanatory diagram illustrating a specific circuit configuration example of the detection unit 130 according to the embodiment of the present disclosure. A circuit configuration example of the detection unit 130 that detects a voltage value of the connection detection signal that the signal output unit 110 outputs to CC1 and CC2 of the connector 120 is illustrated in FIG. 9.

As illustrated in FIG. 9, the detection unit 130 includes comparators 131a, 131b, 132a, and 132b, delay devices 133a and 133b, an AND gate 134, and an OR gate 135. The comparator 131a compares the predetermined voltage value V1 with the voltage value of the connection detection signal that the signal output unit 110 outputs to CC1 of the connector 120. Then, if the voltage value of the connection detection signal that the signal output unit 110 outputs to CC1 of the connector 120 is greater than the predetermined voltage value V1, the comparator 131a outputs a signal to the comparator 132a after the signal is delayed for the predetermined time dt in the delay device 133a. When the comparator 132a receives a signal from the comparator 131a, the comparator 132a compares the predetermined voltage value V2 with the voltage value of the connection detection signal that the signal output unit 110 outputs to CC1 of the connector 120. Then, if the voltage value of the connection detection signal that the signal output unit 110 outputs to CC1 of the connector 120 is not greater than the predetermined voltage value V2, the comparator 132a outputs a signal indicating the fact to the AND gate 134 and the OR gate 135.

Similarly, the comparator 131b compares the predetermined voltage value V1 with the voltage value of the connection detection signal that the signal output unit 110 outputs to CC2 of the connector 120. Then, if the voltage value of the connection detection signal that the signal output unit 110 outputs to CC2 of the connector 120 is greater than the predetermined voltage value V1, the comparator 131b outputs a signal to the comparator 132a after the signal is delayed for the predetermined time dt in the delay device 133b. When the comparator 132b receives a signal from the comparator 131b, the comparator 132b compares the predetermined voltage value V2 with the voltage value of the connection detection signal that the signal output unit 110 outputs to CC2 of the connector 120. Then, if the voltage value of the connection detection signal that the signal output unit 110 outputs to CC2 of the connector 120 is not greater than the predetermined voltage value V2, the comparator 132b outputs a signal indicating the fact to the AND gate 134 and the OR gate 135.

The AND gate 134 gets AND of the comparators 132a and 132b to output the signal WRT_DET_AND. In addition, the OR gate 135 gets OR of the comparators 132a and 132b to output the signal WRT_DET_OR.

Note that, a state where the signal WRT_DET_AND is high is referred to as both-sides detection, and a state where only the signal WRT_DET_OR is high is referred to as one-side detection.

Figure 10:
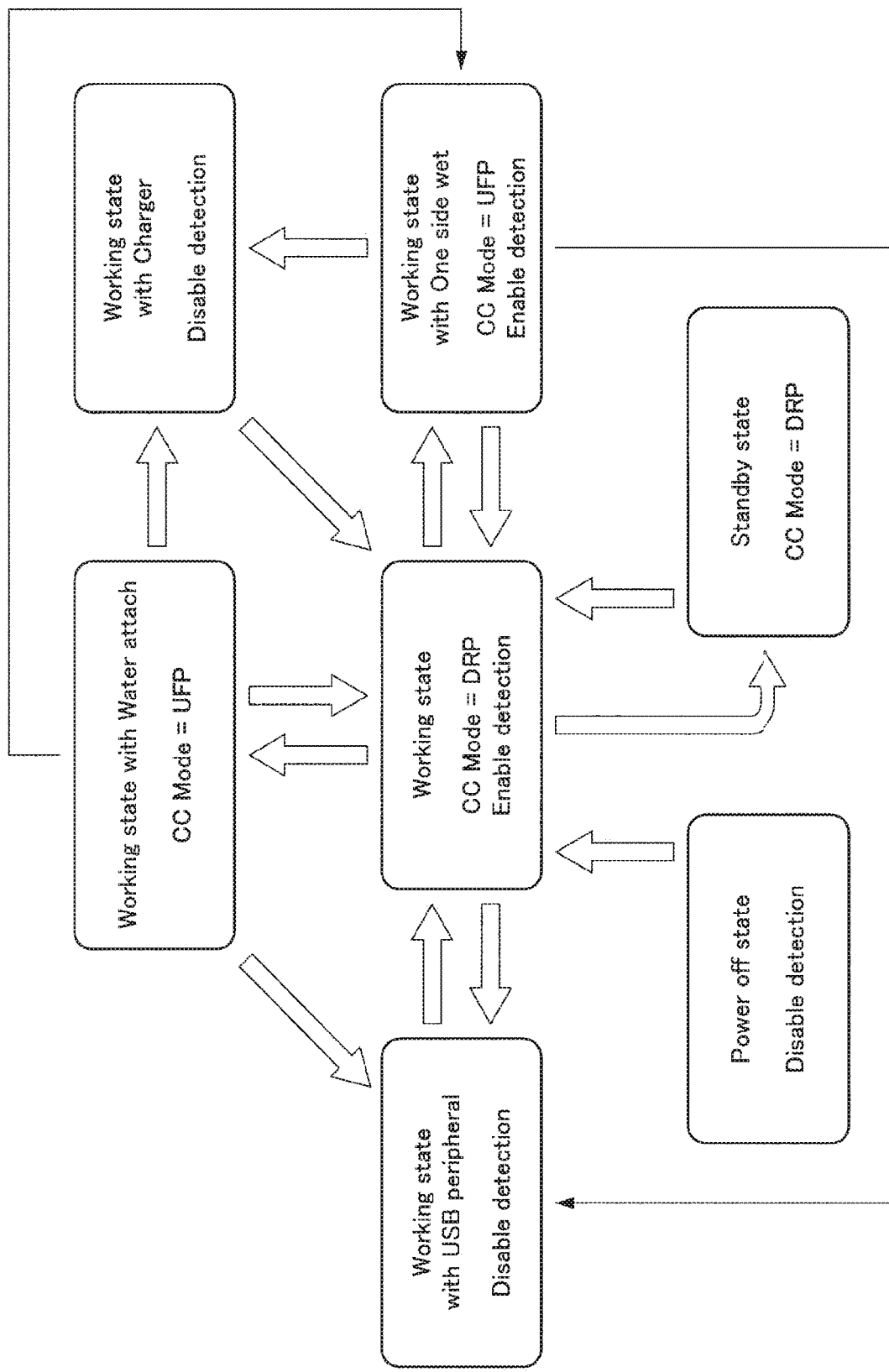
FIG. 10 is a state transition diagram of an information processing device 100.

Subsequently, the operation of the information processing device 100 illustrated in FIGS. 8 and 9 will be described in detail. First, a state transition diagram of the information processing device 100 will be described using FIG. 10. In a state where the information processing device 100 is not turned on, the state of the information processing device 100 is a "Power off state", and in this state, detection of water wetting of the connector 120 is not performed.

When the information processing device 100 is turned on, the information processing device 100 transitions to a "Working state". In this state, the mode of the configuration channel (CC) becomes a DRP mode (mode of outputting the connection detection signal), and detection of water wetting of the connector 120 is performed.

When a change in voltage value of the connection detection signal is detected on both sides of the connector 120 in a case where the state is the Working state, the information processing device 100 detects that the connector 120 is wet with water, and the state transitions to a "Working state with Water Attach". In this state, the mode of the configuration channel (CC) becomes a UFP mode (mode of not outputting the connection detection signal). When water is removed from the connector 120, the information processing device 100 transitions to the "Working state".

Furthermore, when a change in voltage value of the connection detection signal is detected only on one side of the connector 120 in a case where the state is the Working state, the state of the information processing device 100 becomes the "Working state with One side wet", and the mode of the configuration channel (CC) becomes the UFP mode (mode of not outputting the connection detection signal). When water is removed from the connector 120, the information processing device 100 transitions to the "Working state".

Further, when the screen is turned off in a case where the state is the "Working state", the information processing device 100 transitions to a "Standby state". When the screen is turned on in a case where the state is the "Standby state", the information processing device 100 transitions to the "Working state". Furthermore, in a case where the state is the "Working state", when a charger is connected to the connector 120, the information processing device 100 transitions to a "Working state with Charger". Furthermore, in a case where the state is the "Working state", when a device that does not charge the information processing device 100 is connected to the connector 120, the information processing device 100 transitions to a "Working state with USB peripheral".

Figure 11:
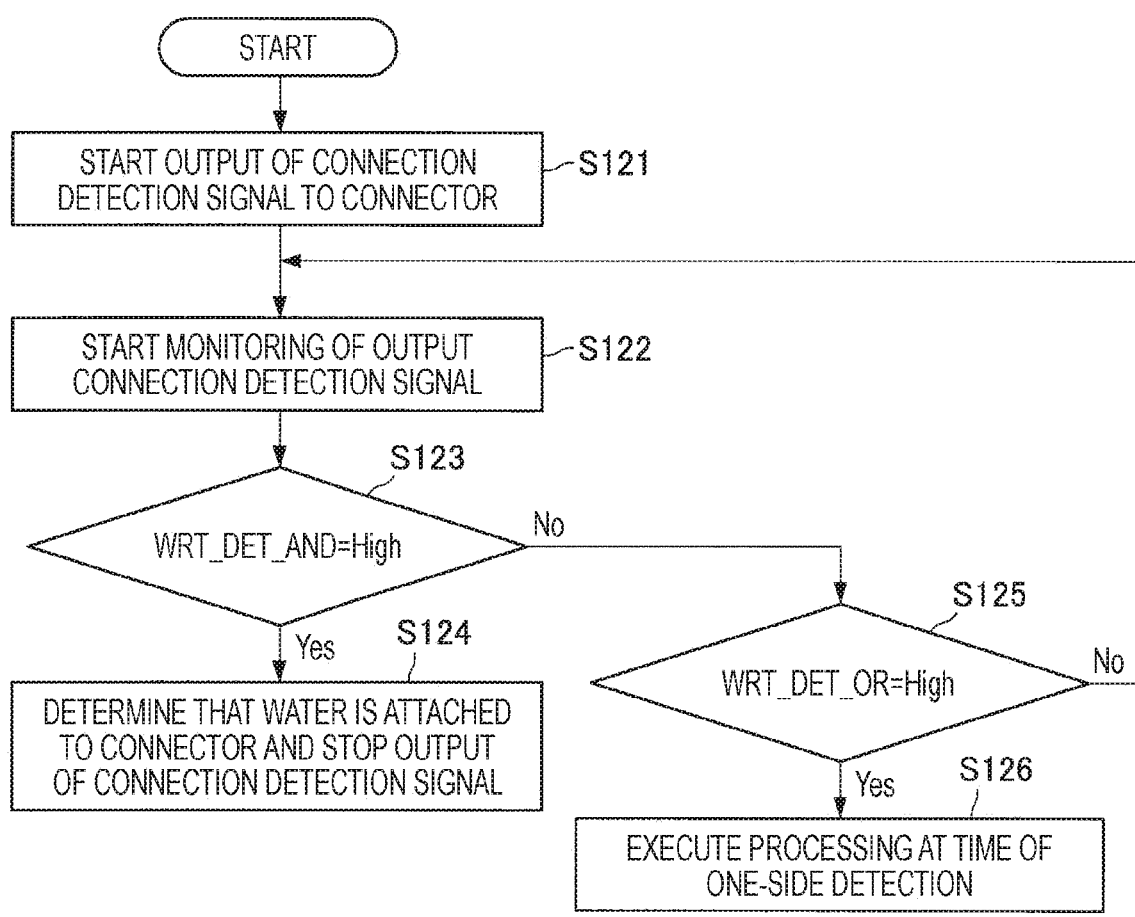
FIG. 11 is a flowchart illustrating an operation example of an information processing device 100 according to an embodiment of the present disclosure.

FIG. 11 is a flowchart illustrating an operation example of the information processing device 100 illustrated in FIGS. 8 and 9. Hereinafter, the operation example of the information processing device 100 illustrated in FIGS. 8 and 9 will be described using FIG. 11.

When the information processing device 100 starts output of a connection detection signal from the signal output unit 110 to the connector 120 (step S121), the information processing device 100 starts monitoring of the connection detection signal using the detection unit 130 (step S122).

Subsequently, the information processing device 100 determines, using the signal control unit 140, whether the signal WRT_DET_AND from the detection unit 130 is high (step S123). If the signal WRT_DET_AND is high (step S123, Yes), the information processing device 100 determines that water is attached to the connector 120, and stops output of the connection detection signal from the signal output unit 110 to the connector 120 (step S124).

Meanwhile, if the signal WRT_DET_AND is low (step S123, No), subsequently the information processing device 100 determines, using the signal control unit 140, whether the signal WRT_DET_OR from the detection unit 130 is high (step S125). If the signal WRT_DET_OR is high (step S125, Yes), the information processing device 100 executes processing at the time of one-side detection (step S126). The details of the processing at the time of one-side detection will be described later. Meanwhile, if the signal WRT_DET_OR is low (step S125, No), the process returns to the detection processing of monitoring the connection detection signal in step S122.

Figure 12:
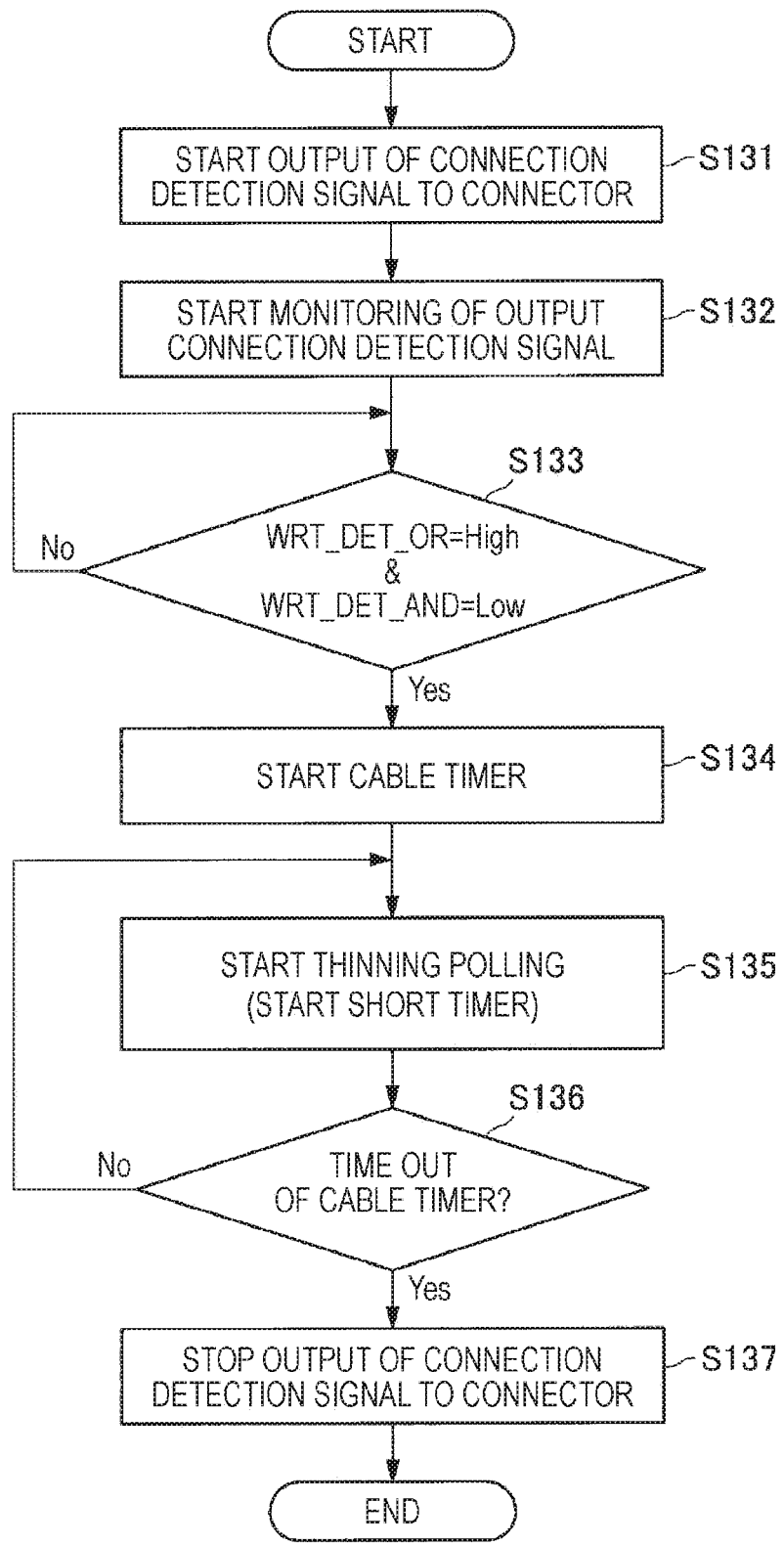
FIG. 12 is a flowchart illustrating an operation example of an information processing device 100 according to an embodiment of the present disclosure.

FIG. 12 is a flowchart illustrating an operation example of the information processing device 100 illustrated in FIGS. 8 and 9. The processing at the time of one-side detection by the information processing device 100 is illustrated in FIG. 12. Hereinafter, the operation example of the information processing device 100 illustrated in FIGS. 8 and 9 will be described using FIG. 12.

When the information processing device 100 starts output of a connection detection signal from the signal output unit 110 to the connector 120 (step S131), the information processing device 100 starts monitoring of the connection detection signal using the detection unit 130 (step S132).

Thereafter, the information processing device 100 determines, using the signal control unit 140, whether the signal WRT_DET_AND is low and the signal WRT_DET_OR is high (step S133). If the signal WRT_DET_AND is low and the signal WRT_DET_OR is high (step S133, Yes), the information processing device 100 turns on a predetermined timer (referred to as a cable timer) (step S134). When the cable timer is turned on, subsequently the information processing device 100 starts a timer (referred to as a short timer) that times out in a time shorter than the cable timer, and outputs the connection detection signal only in a part of the period of the short timer (step S135). The time-out time of the cable timer is set to be longer than the time-out time of the short timer. The time-out time of the short timer is, for example, 7 seconds, and the time-out time of the cable timer is, for example, 45 seconds. Of course, needless to say, the time-out time of the timer is not limited to such examples. In the present embodiment, outputting the connection detection signal only in a part of the period of the short timer is referred to as thinning polling. Thereafter, the information processing device 100 executes thinning polling until the cable timer times out (step S136), and when the cable timer times out (step S136, Yes), the information processing device 100 stops output of the connection detection signal from the signal output unit 110 to the connector 120 (step S137).

The information processing device 100 determines whether a voltage $V_{BUS}$ is detected in any of pins A4, A9, B4, and B9 in the pin configuration illustrated in FIG. 1 to determine that charging is currently being performed. This corresponds to the state of "Working state with Charger" illustrated in FIG. 10. Then, the information processing device 100 determines whether a voltage $V_{BUS}$ becomes not detected in all of the pins A4, A9, B4, and B9 in the pin configuration illustrated in FIG. 1, from the charging state, and if the voltage $V_{BUS}$ is not detected, the information processing device 100 may start again the output of the connection detection signal from the signal output unit 110 to the connector 120. Meanwhile, if the voltage $V_{BUS}$ is continuously detected, the information processing device 100 may continue the state of determining that charging is currently being performed.

Meanwhile, when the voltage $V_{BUS}$ is not detected, the information processing device 100 turns on the cable timer, and if the cable timer has timed out, the information processing device 100 may stop output of the connection detection signal from the signal output unit 110 to the connector 120. Meanwhile, if the cable timer has not timed out, the short timer different from the cable timer is turned on, and if the cable timer has timed out, the output of the connection detection signal from the signal output unit 110 to the connector 120 may be started again.

In other words, at the time of one-side detection, the information processing device 100 according to the embodiment of the present disclosure turns on the cable timer that times out in a predetermined time, and then the information processing device 100 according to the embodiment of the present disclosure executes a thinning operation for the output of the connection detection signal from the signal output unit 110 to the connector 120 until the cable timer has timed out.

Figure 13:
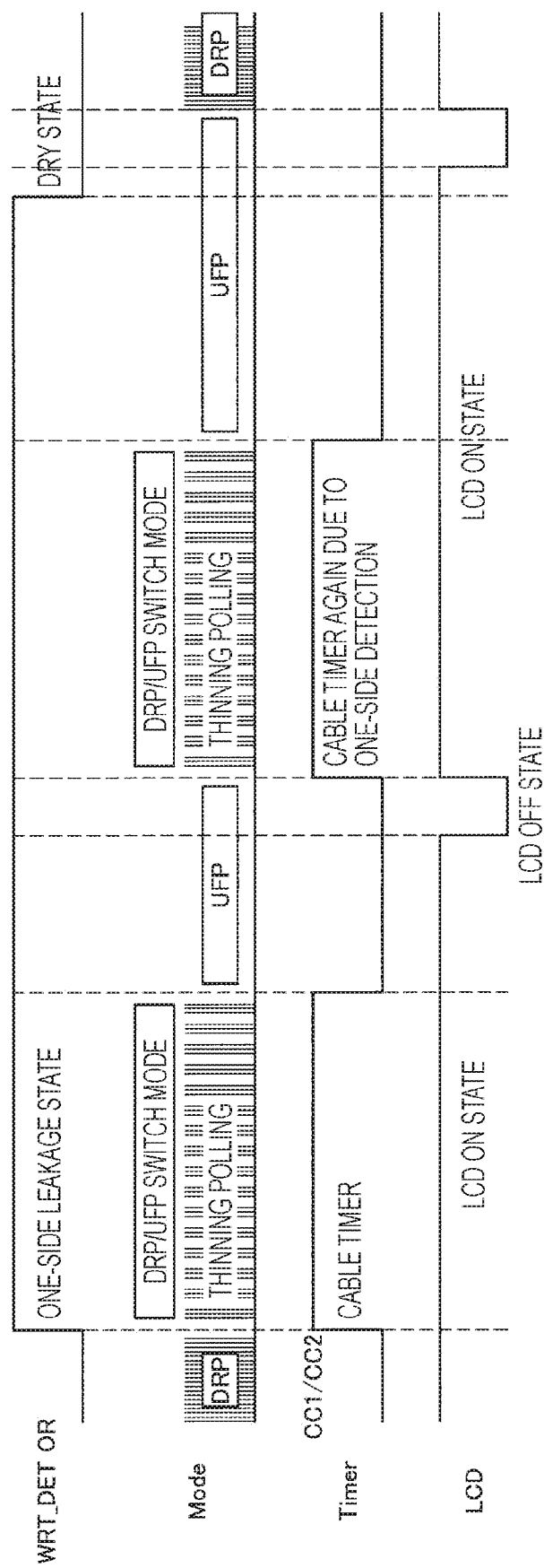
FIG. 13 is an explanatory diagram illustrating an operation of an information processing device 100 according to an embodiment of the present disclosure.

FIG. 13 is an explanatory diagram illustrating an operation of the information processing device 100 according to the embodiment of the present disclosure. Here, it is assumed that the signal WRT_DET_AND is omitted and the signal WRT_DET_AND is always low. When the signal WRT_DET_OR is low, the information processing device 100 sets the mode of CC to the DRP mode (mode of outputting the connection detection signal). From this state, when the signal WRT_DET_OR becomes high, the information processing device 100 repeats the DRP mode and the UFP mode for the mode of CC. The state in which the DRP mode and the UFP mode are repeated is referred to as a DRP/UFP switch mode.

Furthermore, when the signal WRT_DET_OR transitions to high from low, the cable timer is turned on. If the signal WRT_DET_OR is high, the information processing device 100 continues the DRP/UFP switch mode until the cable timer times out. Then, when the cable timer times out, the information processing device 100 sets the mode of CC to the UFP mode and stops output of the connection detection signal.

After the cable timer times out, the information processing device 100 may turn on the cable timer, which has been turned off, again using a transition of the screen from the off state to the on state as a trigger. Furthermore, the information processing device 100 can set a time until the screen is automatically turned off after the last operation, but the information processing device 100 may automatically change a time-out time of the cable timer by considering the time until the screen is automatically turned off. The information processing device 100 may set, for example, a predetermined percentage (for example, 80% to 90%) of the time until the screen is automatically turned off to the time-out time of the cable timer. If the time until the screen is automatically turned off is set to 1 minute, the information processing device 100 may set the time-out time of the cable timer to 50 seconds. In addition, if the time until the screen is automatically turned off is set to 2 minutes, the information processing device 100 may set the time-out time of the cable timer to 1 minute and 40 seconds.

Then, when the signal WRT_DET_OR transitions to low from high, the information processing device 100 sets the mode of CC to the DRP mode and starts again the periodic output of the connection detection signal. The information processing device 100 may record terminal information such as the number of times of detection of the signal WRT_DET_AND, and the elapsed time from high to low of the signal WRT_DET_AND. The information processing device 100 may include a mechanism for leaning by itself using the recorded terminal information. Then, the information processing device 100 may dynamically change the time of the short timer in accordance with the use status of the user by using the learning result of the terminal information. By dynamically changing the time of the short timer, it is possible to automatically implement coexistence of the prevention of corrosion due to the flooding and the optimization in the individual usage forms.

In addition, the information processing device 100 may store the detection result of the detection unit 130 and change the output interval of the signal by using the detection result. The information processing device 100 may store, for example, a flooding period and the number of times of flooding to learn a flooding frequency, and may dynamically change a polling period in accordance with the use status of the user. The corrosion of the terminal proceeds over an accumulation time of the flooding of the terminal. Thus, the information processing device 100 may learn a flooding accumulation time integrated by the number of times of flooding and the flooding period and may change the polling period between in a case where the flooding accumulation time is short and in a case where the flooding accumulation time is long. The information processing device 100 can automatically optimize coexistence of protection from corrosion due to flooding and usability in a terminal by dynamically changing the polling period. For example, in a case where the flooding accumulation time is long, the information processing device 100 may extend the polling period as compared with a case where the flooding accumulation time is short. By extending the polling period, it is possible to further delay the progress of corrosion of a period during which the cable timer is being turned on in the one-side flooding state. Meanwhile, in a case where the flooding accumulation time is short, the polling period may be shortened. By shortening the polling period, it is possible to improve a reaction speed of detecting a peripheral device.

By operating in this manner, the information processing device 100 according to the embodiment of the present disclosure can prevent corrosion of a terminal of the connector 120 by reducing the output frequency of the connection detection signal if water is actually attached to only one side of the connector 120. Meanwhile, in a case where the voltage value of any one of the two pins, CC1 and CC2, of the connector 120 does not reach the prescribed potential within the predetermined time due to the connection of the conversion connector, it is possible to detect connection when a device is connected to the end of the cable.

As described using FIG. 7, the information processing device 100 according to the embodiment of the present disclosure may display the notification message 161 on the display unit 160 when it is detected that the connector 120 is wet with water. Meanwhile, as described above, even when water is not attached to the connector 120, since the one-side detection can occur, the notification message 161 may not be displayed in a case where one-side detection is made for the connector 120.

Furthermore, the information processing device 100 according to the embodiment of the present disclosure may make the contents of the notification message 161 displayed on the display unit 160 same or may change the contents of the notification message 161 displayed on the display unit 160 between in a case where one-side detection is performed for the connector 120 and in a case where both-side detection is performed. Furthermore, whether to display the notification message 161 in a case where the one-side detection is performed for the connector 120 may be switched by the setting of the information processing device 100. In addition, the information processing device 100 according to the embodiment of the present disclosure may display the notification message 161 on the display unit 160 as the time of the cable timer elapses, or may change the contents of the notification message 161 displayed on the display unit 160. The information processing device 100 according to the embodiment of the present disclosure may display a message for urging the user to check whether the connector 120 is wet with water, as the notification message 161 on the display unit 160, at a time point when the remaining time of the cable timer becomes, for example, 10 seconds.

2. SUMMARY

According to the embodiment of the present disclosure described above, the information processing device 100 is provided which is capable of detecting connection of a peripheral device even in a standby state and of completely preventing corrosion of a terminal by stopping output of a signal for detection when it is detected that water is attached to the connector.

The respective steps in the processing executed by the devices in the present specification are not necessarily processed in time series in the order described as the sequence diagram or flowchart. For example, the respective steps in the processing executed by the devices may be processed in an order different from the order described as the flowchart, or may be processed in parallel.

Furthermore, it is also possible to create a computer program for causing hardware such as a CPU, a ROM, and a RAM built in the devices to exhibit the same functions as the configurations of the above-described devices. Furthermore, it is possible to provide a storage medium in which the computer program is stored. Furthermore, the functional blocks illustrated in the functional block diagram are configured by hardware, so that it is possible to implement a series of processing by hardware.

Heretofore, the preferred embodiments of the present disclosure have been described in detail with reference to the accompanying drawings, but the technical scope of the present disclosure is not limited to such examples. It is obvious that a person having ordinary skills in the technical field of the present disclosure can conceive of various modifications or alterations within the scope of the technical idea described in claims, and it is understood that the modifications or the alterations naturally belong to the technical scope of the present disclosure.

Furthermore, the effects described in the present specification are merely illustrative or exemplary, and are not limited. That is, the technique according to the present disclosure can exhibit other effects that are apparent to those skilled in the art from the description of the present specification, in addition to the above-described affects or instead of the above-described effects.

Note that, the following configurations also belong to the technical scope of the present disclosure.

(1)
An information processing device including:
a voltage detection unit configured to monitor a voltage value of a signal output to a predetermined terminal of a connector at a predetermined timing; and
a signal control unit configured to stop output of the signal if the voltage value after a predetermined time elapses from when the voltage value detected by the voltage detection unit exceeds a first value does not exceed a second value greater than the first value.

(2)
The information processing device described in (1), in which the signal is a signal of detecting that a device is connected to the connector.

(3)
The information processing device described in (1) or (2), in which the signal is a signal conforming to a Universal Serial Bus (USB) Type-C standard.

(4)
The information processing device described in any one of (1) to (3), further including:
a display control unit configured to control display of information,
in which the signal control unit outputs an instruction for displaying predetermined information to the display control unit when output of the signal is stopped.

(5)
The information processing device described in (4), in which the display control unit displays information indicating that water is attached to the predetermined terminal, as the predetermined information.

(6)
The information processing device described in (1),
in which the voltage detection unit monitors voltage values of signals output to a first terminal and a second terminal as the predetermined terminal, and
the signal control unit extends an output interval of the signals until a predetermined time-out time elapses if, in any one of the first terminal and the second terminal, the voltage value after a predetermined time elapses from when the voltage value detected by the voltage detection unit exceeds the first value does not exceed the second value.

(7)
The information processing device described in (6), in which the signal control unit stops output of the signal if the voltage value does not exceed the second value even when the predetermined time-out time elapses.

(8)
The information processing device described in (7), in which the signal control unit starts output of the signal again when a display is turned on from being turned off after the predetermined time-out time elapses.

(9)
The information processing device described in (8), in which the signal control unit sets the predetermined time-out time on the basis of a time until the display is automatically turned off after a last operation.

(10)
The information processing device described in any one of (6) to (9), in which the signal control unit stores a detection result by the voltage detection unit, and changes an output interval of the signal by using the detection result.

(11)
The information processing device described in any one of (6) to (10), in which the signal control unit stores a detection result by the voltage detection unit, and changes a period of extending an output interval of the signal by using the detection result.

(12)
The information processing device described in any one of (6) to (11), further including:
a display control unit configured to control display of information,
in which the signal control unit outputs an instruction for displaying predetermined information to the display control unit when a predetermined time elapses after the output interval of the signal starts to be extended.

(13)
A control circuit including:
a voltage detection unit configured to monitor a voltage value of a signal output at a predetermined timing; and
a signal control unit configured to stop output of the signal if the voltage value after a predetermined time elapses from when the voltage value detected by the voltage detection unit exceeds a first value does not exceed a second value greater than the first value.

(14)
A control method including:
monitoring a voltage value of a signal output at a predetermined timing; and
stopping output of the signal if the voltage value after a predetermined time elapses from when the detected voltage value exceeds a first value does not exceed a second value greater than the first value.

REFERENCE SIGNS LIST

100 Information processing device
110 Signal output unit
120 Connector
130 Detection unit
131 Comparator
132 Comparator
133 Delay device
140 Signal control unit
150 Display control unit
160 Display unit

The invention claimed is:
1. An information processing device comprising:
circuitry configured to
monitor a voltage value of connection detection signals output to a first terminal and a second terminal of a connector at a predetermined timing, the second terminal being provided on a side opposite to the first terminal;
determine whether at least one of the voltage value of the connection detection signals of the first terminal and the second terminal of the connector exceeds a first value within a first time period;
stop output of the connection detection signals to the first terminal and the second terminal of the connector, under a condition that both of the voltage value of the connection detection signals of the first terminal and the second terminal of the connector do not exceed the first value within the first time period; and
perform one-side detection under a condition that one of the voltage value of the connection detection signals of the first terminal or the second terminal of the connector exceeds the first value within the first time period, and the other one of the voltage value of the connection detection signals of the first terminal or the second terminal of the connector does not exceed the first value within the first time period.

2. The information processing device according to claim 1, wherein the connection detection signal is a signal of detecting that a device is connected to the connector.

3. The information processing device according to claim 1, wherein the connection detection signal is a signal conforming to a Universal Serial Bus (USB) Type-C standard.

4. The information processing device according to claim 1,
wherein the circuitry is further configured to control display of predetermined information on a display which is connected to the information processing device, the predetermined information indicating that the output of the connection detection signals to the connector is stopped, under the condition that both of the voltage value of the connection detection signals of the first terminal and the second terminal of the connector do not exceed the first value within the first time period.

5. The information processing device according to claim 4, wherein the circuitry is configured to display information indicating that water is attached to the first and the second terminals, as the predetermined information.

6. The information processing device according to claim 4,
wherein the circuitry is configured to start a cable timer as the one-side detection,
wherein the circuitry is configured to perform a thinning polling until a time-out time of the cable timer elapses, the thinning polling being a connection detection of the connection detection signals within a second time period that is shorter than the first time period, by extending
an output interval of the connection detection signals.

7. The information processing device according to claim 6, wherein the circuitry is configured to stop output of the connection detection signals after the time-out time of the cable timer elapses.

8. The information processing device according to claim 7, wherein the circuitry is configured to control modes between an enable detection mode and a disable detection mode based on a plurality of states of the information processing device, the plurality of states of the information processing device including at least one of a working state, a power off state, and a standby state.

9. The information processing device according to claim 8, wherein the circuitry is configured to set the time-out time of the cable timer on a basis of a time until the display is automatically turned off after a last operation, which corresponds to a transition from the working state to the standby state.

10. The information processing device according to claim 6, wherein the circuitry is configured to store a detection, and change an output interval of the connection detection signals by using the detection result.

11. The information processing device according to claim 6, wherein the circuitry is configured to store a detection result, and change a period of extending the output interval of the connection detection signals by using the detection result.

12. The information processing device according to claim 6,
wherein the circuitry is configured to display information, on the display that a predetermined time elapses after the output interval of the connection detection signals starts to be extended.

13. A control circuit comprising:
circuitry configured to
monitor a voltage value of connection detection signals output to a first terminal and a second terminal of a connector at a predetermined timing, the second terminal being provided on a side opposite to the first terminal;
determine whether at least one of the voltage value of the connection detection signals of the first terminal and the second terminal of the connector exceeds a first value within a first time period;
stop output of the connection detection signals to the first terminal and the second terminal of the connector, under a condition that both of the voltage value of the connection detection signals of the first terminal and the second terminal of the connector do not exceed the first value within the first time period; and
perform one-side detection under a condition that one of the voltage value of the connection detection signals of the first terminal or the second terminal of the connector exceeds the first value within the first time period, and the other one of the voltage value of the connection detection signals of the first terminal or the second terminal of the connector does not exceed the first value within the first time period.

14. A control method comprising:
monitoring a voltage value of connection detection signals output to a first terminal and a second terminal of a connector at a predetermined timing, the second terminal being provided on a side opposite to the first terminal;
determining whether at least one of the voltage value of the connection detection signals of the first terminal and the second terminal of the connector exceeds a first value within a first time period;
stopping output of the connection detection signals to the first terminal and the second terminal of the connector, under a condition that both of the voltage value of the connection detection signals of the first terminal and the second terminal of the connector do not exceed the first value within the first time period; and
performing one-side detection under a condition that one of the voltage value of the connection detection signals of the first terminal or the second terminal of the connector exceeds the first value within the first time period, and the other one of the voltage value of the connection detection signals of the first terminal or the second terminal of the connector does not exceed the first value within the first time period.

15. The information processing device according to claim 8,
wherein the information processing device is shifted from the power off state to the working state when the power is charged, and, in the working state, the circuitry is configured to start determination whether at least one of the voltage value of the connection detection signals of the first terminal and the second terminal of the connector exceeds the first value within the first time period.

16. The information processing device according to claim 8,
wherein the information processing device is shifted from the working state to a working state with water attach, when both of the voltage value of the connection detection signals of the first terminal and the second terminal of the connector do not exceed the first value within the first time period, and wherein the information processing device is shifted from the working state with water attach to the working state when the circuitry is configured to detect that the water is removed from the connector.

17. The information processing device according to claim 8, wherein the information processing device is shifted from the working state to a working state with charger, when the circuitry is configured to detect that a battery is connected to the connector, wherein the circuitry is configured to stop output of the connection detection signals in the working state with charger.

18. The information processing device according to claim 8, wherein the information processing device is shifted from the working state to a working state with peripheral, when the circuitry is configured to detect that a peripheral device except for a battery is connected to the connector, wherein the circuitry is configured to stop output of the connection detection signals in the working state with peripheral.

19. The information processing device according to claim 8, wherein the information processing device is shifted from the working state to a working state with one side wet, when one of the voltage value of the connection detection signals of the first terminal or the second terminal of the connector exceeds the first value within the first time period, and the other one of the voltage value of the connection detection signals of the first terminal or the second terminal of the connector does not exceed the first value within the first time period, wherein the circuitry is configured to perform the one-side detection in the working state with one side wet, and wherein the information processing device is shifted from the working state with one side wet to the working state when the circuitry is configured to detect that the water is removed from the connector.

20. The information processing device according to claim 6, wherein the circuitry is configured to store a flooding period and a number of times of flooding to learn a flooding frequency, and dynamically change the second time period based on the flooding frequency.

* * * * *

UNITED STATES PATENT AND TRADEMARK OFFICE
CERTIFICATE OF CORRECTION

PATENT NO. : 11,482,188 B2
APPLICATION NO. : 16/500816
DATED : October 25, 2022
INVENTOR(S) : Toshihide Shimuzu It is certified that error appears in the above-identified patent and that said Letters Patent is hereby corrected as shown below:

In the Claims

Claim 1, Column 16, Line 47, "a voltage value" should read --voltage values--.

Claim 1, Column 16, Line 52, "value" should read --values--.

Claim 1, Column 16, Line 58, "value" should read --values--.

Claim 1, Column 16, Line 63, "value" should read --values--.

Claim 1, Column 16, Line 66, "value" should read --values--.

Claim 4, Column 17, Line 17, "value" should read --values--.

Claim 13, Column 18, Line 3, "a voltage value" should read --voltage values--.

Claim 13, Column 18, Line 8, "value" should read --values--.

Claim 13, Column 18, Line 14, "value" should read --values--.

Claim 13, Column 18, Line 19, "value" should read --values--.

Claim 13, Column 18, Line 22, "value" should read --values--.

Claim 14, Column 18, Line 27, "a voltage value" should read --voltage values--.

Claim 14, Column 18, Line 32, "value" should read --values--.

Claim 14, Column 18, Line 38, "value" should read --values--.

Signed and Sealed this
Twentieth Day of December, 2022

Katherine Kelly Vidal
*Director of the United States Patent and Trademark Office*

CERTIFICATE OF CORRECTION (continued)
U.S. Pat. No. 11,482,188 B2

Claim 14, Column 18, Line 43, "value" should read --values--.

Claim 14, Column 18, Line 46, "value" should read --values--.

Claim 15, Column 18, Line 56, "value" should read --values--.

Claim 16, Column 18, Line 64, "value" should read --values--.

Claim 19, Column 20, Line 5, "value" should read --values--.

Claim 19, Column 20, Line 9, "value" should read --values--.